US 8,519,353 B2

(12) United States Patent
Radovanov et al.

(10) Patent No.: US 8,519,353 B2
(45) Date of Patent: Aug. 27, 2013

(54) METHOD AND APPARATUS FOR CONTROLLING AN ASYMMETRIC ELECTROSTATIC LENS ABOUT A CENTRAL RAY TRAJECTORY OF AN ION BEAM

(75) Inventors: Svetlana Radovanov, Marblehead, MA (US); Peter L. Kellerman, Essex, MA (US); Frank Sinclair, Quincy, MA (US); Robert C. Lindberg, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 173 days.

(21) Appl. No.: 12/981,096

(22) Filed: Dec. 29, 2010

(65) Prior Publication Data

US 2012/0168637 A1 Jul. 5, 2012

(51) Int. Cl.
*H01J 1/88* (2006.01)
*H01J 3/18* (2006.01)
*H01J 3/38* (2006.01)
*G21K 1/06* (2006.01)

(52) U.S. Cl.
USPC .................................. 250/396 R; 250/492.3

(58) Field of Classification Search
USPC ............ 250/396 R, 396 ML, 492.22, 492.23; 335/210
See application file for complete search history.

(56) References Cited

U.S. PATENT DOCUMENTS

| | | | |
|---|---|---|---|
| 4,963,748 A | 10/1990 | Szilagyi | |
| 5,079,428 A * | 1/1992 | Da Lin et al. | 250/396 ML |
| 5,707,485 A * | 1/1998 | Rolfson et al. | 438/716 |
| 6,414,319 B1 | 7/2002 | Spehr | |
| 6,441,382 B1 | 8/2002 | Huang | |
| 7,459,693 B2 * | 12/2008 | Park et al. | 250/396 R |
| 7,491,945 B2 * | 2/2009 | Nagano | 250/396 R |
| 7,491,953 B2 * | 2/2009 | Horsky et al. | 250/396 ML |
| 2003/0066961 A1 | 4/2003 | Kienzle et al. | |
| 2004/0105160 A1 | 6/2004 | Kienzle et al. | |
| 2004/0113092 A1 * | 6/2004 | Knippelmeyer | 250/396 R |
| 2005/0072941 A1 * | 4/2005 | Tanimoto et al. | 250/492.22 |
| 2006/0113494 A1 | 6/2006 | Chen et al. | |
| 2006/0145097 A1 * | 7/2006 | Parker | 250/492.22 |
| 2007/0125956 A1 * | 6/2007 | Buschbeck et al. | 250/396 R |
| 2007/0262255 A1 * | 11/2007 | Feuerbaum | 250/396 R |
| 2008/0078951 A1 * | 4/2008 | Renau et al. | 250/396 R |
| 2009/0159810 A1 * | 6/2009 | Knippelmeyer et al. | 250/396 ML |
| 2009/0212214 A1 * | 8/2009 | Kimba | 250/396 R |
| 2010/0065761 A1 | 3/2010 | Graf et al. | |
| 2010/0171042 A1 | 7/2010 | Kellerman et al. | |
| 2011/0155921 A1 | 6/2011 | Kellerman et al. | |

FOREIGN PATENT DOCUMENTS

JP 04284343 A 10/1992
WO 02052609 A2 7/2002

* cited by examiner

*Primary Examiner* — Phillip A Johnston
*Assistant Examiner* — Brooke Purinton

(57) ABSTRACT

A method of controlling deflection of a charged particle beam in an electrostatic lens includes establishing a symmetrical electrostatic lens configuration comprising a plurality of electrodes disposed at unadjusted positions that are symmetric with respect to the central ray trajectory with applied unadjusted voltages that create fields symmetric with respect to the central ray trajectory. A symmetric electric field is calculated corresponding to the set of unadjusted voltages. A plurality of lower electrodes is arranged at adjusted positions that are asymmetric with respect to the central ray trajectory. A set of adjusted voltages is obtained for the plurality of lower electrodes, wherein the set of adjusted voltages corresponds to a set of respective potentials of the symmetric electric field at respective adjusted asymmetric positions. The adjusted voltages are applied to the asymmetric lens configuration when the charged particle beam passes therethrough.

17 Claims, 13 Drawing Sheets

METHOD AND APPARATUS FOR CONTROLLING AN ASYMMETRIC ELECTROSTATIC LENS ABOUT A CENTRAL RAY TRAJECTORY OF AN ION BEAM

BACKGROUND OF THE INVENTION

1. Field of the Invention

Embodiments of the invention relate to the field of ion implantation for forming semiconductor structures. More particularly, the present invention relates to a method for controlling deflection of a charged particle beam within a graded electrostatic lens.

2. Discussion of Related Art

Ion implanters are widely used in semiconductor manufacturing to selectively alter conductivity of materials. In a typical ion implanter, ions generated from an ion source are directed through a series of beam-line components that may include one or more analyzing magnets and a plurality of electrodes. The analyzing magnets select desired ion species, filter out contaminant species and ions having undesirable energies, and adjust ion beam quality at a target wafer. Suitably shaped electrodes may modify the energy and the shape of an ion beam.

FIG. 1 shows a conventional ion implanter 100 which comprises an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses can manipulate ion energies and cause the ion beam to hit a target wafer at a desired energy.

The above-mentioned D1 or D2 deceleration lenses are typically electrostatic triode (or tetrode) deceleration lenses. FIG. 2 shows a perspective view of a conventional electrostatic triode deceleration lens 200. The electrostatic triode deceleration lens 200 comprises three sets of electrodes: entrance electrodes 202 (also referred to as "terminal electrodes"), suppression electrodes 204 (or "focusing electrodes"), and exit electrodes 206 (also referred to as "ground electrodes" though not necessarily connected to earth ground). A conventional electrostatic tetrode deceleration lens is similar to the electrostatic triode deceleration lens 200, except that a tetrode lens has an additional set of suppression electrodes (or focusing electrodes) between the suppression electrodes 204 and the exit electrodes 206. In the electrostatic triode deceleration lens 200, each set of electrodes may have a space/gap to allow an ion beam 20 to pass therethrough (e.g., in the +z direction along the beam direction). As shown in FIG. 2, each set of electrodes may include two conductive pieces electrically coupled to each other to share a same voltage potential. Alternatively, each set of electrodes may be a one-piece structure with an aperture for the ion beam 20 to pass therethrough. As such, each set of electrodes is effectively a single electrode having a single voltage potential. For simplicity, each set of electrodes are herein referred to in singular. That is, the entrance electrodes 202 are referred to as an "entrance electrode 202," the suppression electrodes 204 are referred to as a "suppression electrode 204," and the exit electrodes 206 are referred to as an "exit electrode 206."

In operation, the entrance electrode 202, the suppression electrode 204, and the exit electrode 206 are independently biased such that the energy and/or shape of the ion beam 20 is manipulated in the following fashion. The ion beam 20 may enter the electrostatic triode deceleration lens 200 through the entrance electrode 202 and may have an initial energy of, for example, 10-20 keV. Ions in the ion beam 20 may be accelerated between the entrance electrode 202 and the suppression electrode 204. Upon reaching the suppression electrode 204, the ion beam 20 may have an energy of, for example, approximately 30 keV or higher. Between the suppression electrode 204 and the exit electrode 206, the ions in the ion beam 20 may be decelerated, typically to an energy that is closer to the one used for ion implantation of a target wafer. In one example, the ion beam 20 may have an energy of approximately 3-5 keV or lower when it exits the electrostatic triode deceleration lens 200.

The significant changes in ion energies that take place in the electrostatic triode deceleration lens 200 may have a substantial impact on a shape of the ion beam 20. For example, the deceleration lens 200, which may provide co-local deflection for filtering energetic neutrals, may face challenges associated with control of deflection angle and beam focus. Voltage needed to control deflection of the ion beam 20 may depend on the energy of the beam (e.g., both input and output), whereas voltage to control focus of the ion beam 20 may be varied to accommodate ion beams with different current and height. This may lead to difficulty in tuning the ion beam 20 since tuning the size of the ion beam 20 (focus) may not be readily feasible if a position of the ion beam 20 also continues to vary. Conventional systems and methods do not provide a solution for independently controlling the deflection and/or focus of an ion beam in a co-locally deflecting and decelerating lens.

Moreover, it may be desirable to focus high perveance beams in a deceleration lens system that simultaneously deflects the beam through a desired deflection angle. In order to obtain sufficient focusing for high perveance beams, using known deceleration lens systems it may be necessary to use electrode voltages that are impractically large and thus raise the risk of dielectric breakdown. Thus the performance may be limited by the maximum practical voltage that can be applied to the electrodes, thereby limiting the maximum strength of the fields that can be applied to the beam to values that are insufficient to perform the desirable focusing/deflection field strengths. In view of the foregoing, it may be understood that there are significant problems and shortcomings associated with current ion implantation technologies.

SUMMARY OF THE INVENTION

An embodiment of the present invention comprises a method of controlling deflection of a charged particle beam that includes establishing a symmetrical electrostatic lens configuration comprising a plurality of electrodes disposed at unadjusted positions that are symmetric with respect to a central ray trajectory of the charged particle beam with applied unadjusted voltages that create fields symmetric with respect to the central ray trajectory. The method further includes calculating a symmetrical electric field corresponding to the set of unadjusted voltages. The method also includes arranging the plurality of electrodes at adjusted positions that are asymmetric with respect to the central ray trajectory and obtaining a set of adjusted voltages for the plurality of electrodes, wherein the set of adjusted voltages corresponds to a set of respective potentials of the symmetric electric field at respective adjusted asymmetric positions. The set of adjusted voltages are applied to the asymmetric lens configuration when the charged particle beam passes therethrough.

In a further embodiment of the invention, a method of controlling deflection of a charged particle beam in an electrostatic lens, includes obtaining a set of a upper electrode positions and a set of unshifted lower electrode positions for a symmetrical configuration that comprises a plurality of upper electrodes and a plurality of lower electrodes, wherein the symmetrical configuration is operable to produce a first deflection field that guides a central ray trajectory of the beam through a first deflection angle along a first path defining a center line of the symmetrical configuration, when a first set of voltages that includes a first set of lower electrode voltages is applied to the upper and lower electrode. The method also includes arranging the plurality of lower electrodes at shifted positions closer to a center line of the symmetric lens configuration, wherein the central ray trajectory defines an increased deflection angle that is larger than the first deflection angle when the first set of voltages is applied to the upper and lower electrodes. The method further includes determining a set of reduced voltages for the plurality of lower electrodes, wherein the set of reduced voltages is configured to guide the central ray trajectory through a reduced deflection angle that is less than the increased deflection angle, and wherein the set of reduced voltages is less than the first set of lower electrode voltages.

In another embodiment of the invention, an asymmetric electrostatic lens for controlling a charged particle beam includes an entrance aperture for the charged particle beam having a central ray trajectory to pass therethrough, and an exit aperture for the charged particle beam to pass therethrough. The lens includes a set of suppression electrodes that comprises a plurality of upper electrodes and a plurality of lower electrodes. The plurality of upper and lower electrodes are mutually arranged to define a space for the charged particle to pass therethrough, and to define a lens centerline. The plurality of upper and lower electrodes are configured to receive a set of voltages to deflect the charged particle beam through a nominal deflection angle, wherein the plurality of lower electrodes are configured to lie in a set of asymmetric positions along a path that is closer to the central ray trajectory than the plurality of upper electrodes when the central ray trajectory passes through the exit aperture at the nominal deflection angle.

BRIEF DESCRIPTION OF THE DRAWINGS

The accompanying drawings illustrate preferred embodiments of the disclosed method so far devised for the practical application of the principles thereof, and in which.

DESCRIPTION OF EMBODIMENTS

Figure 1:
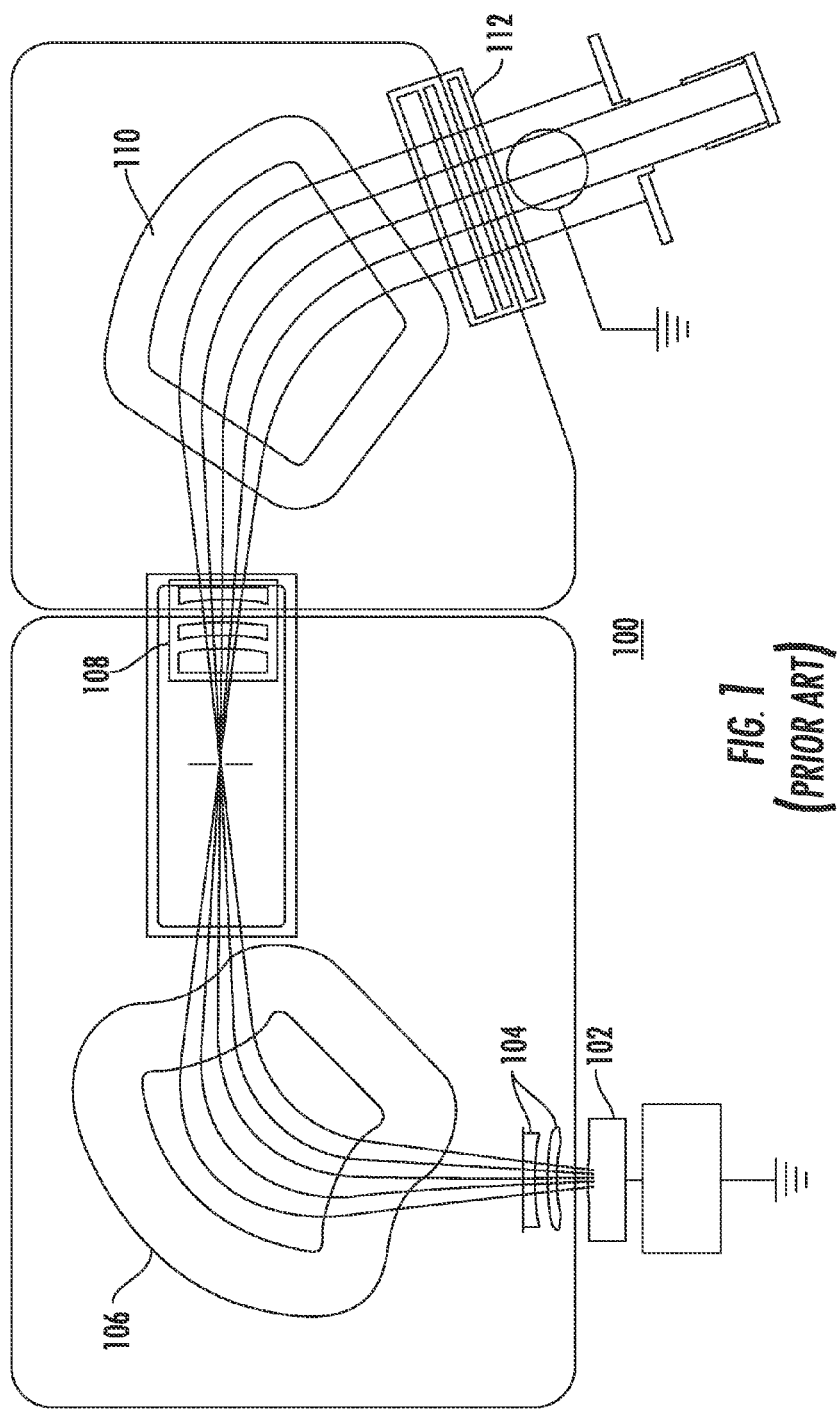
FIG. 1 depicts a conventional ion implanter.
Figure 2:
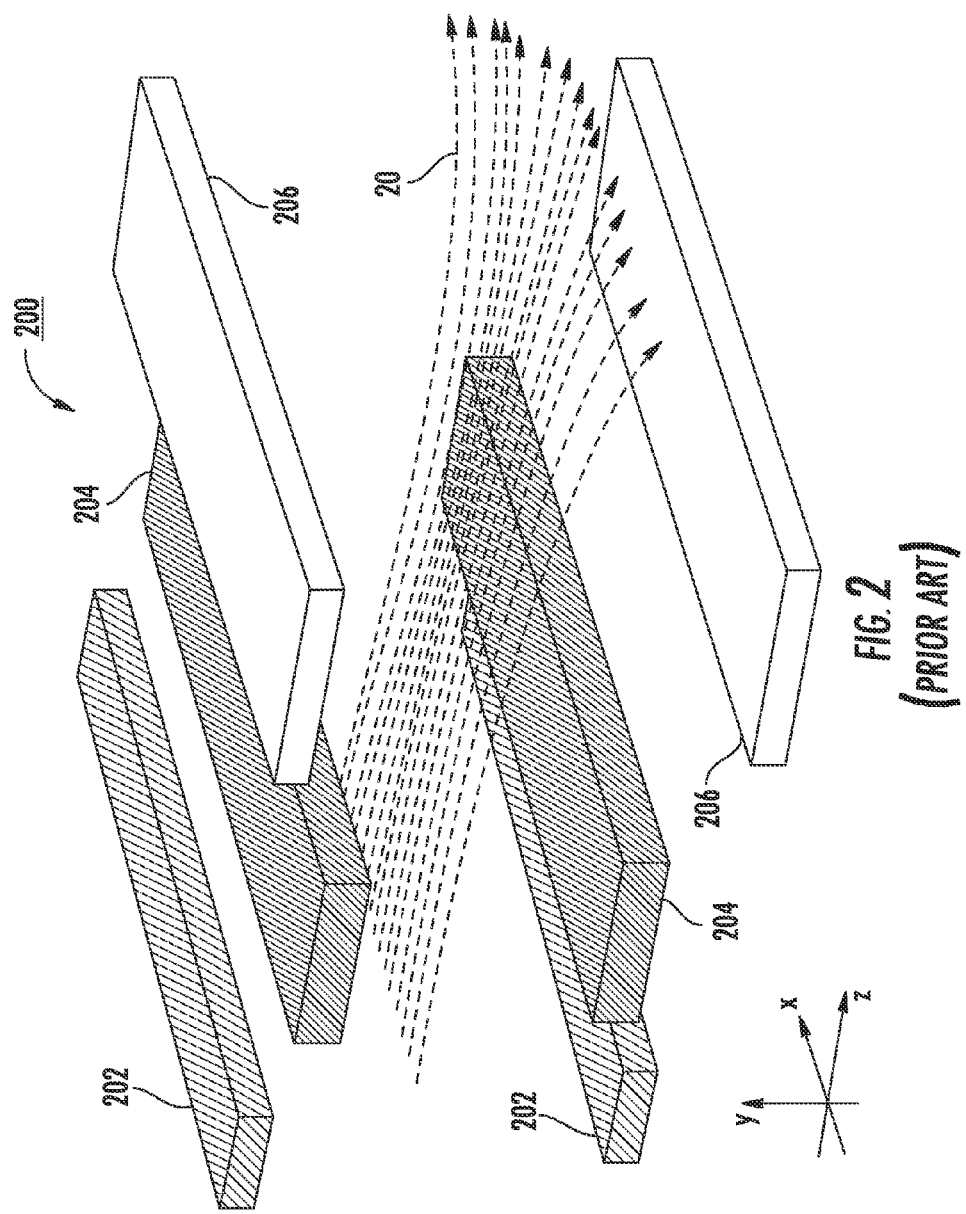
FIG. 2 depicts a conventional electrostatic triode lens.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the problems with conventional lens configurations, an improved lens comprising an asymmetric electrostatic lens configuration is disclosed. The asymmetric electrostatic lens configuration may be a graded deceleration lens that may include one or more variable-control suppression/focusing electrodes. These electrodes may include a variety of shapes, curvatures, positions, materials, and/or configurations that are independently or separately controlled/biased with respect to one another thereby providing flexible and effective manipulation of an ion beam's shape as well as its energy.

While the examples described herein primarily describe a deceleration and filtering lens, the present invention is capable of implementation in accelerating or focusing lenses that include an overall deflection.

For the purposes of more clearly describing the asymmetric electrostatic lens of the present invention in the discussion to follow, aspects of a symmetric electrostatic lens are reviewed initially. In particular, techniques and systems to improve the conventional electrostatic triode deceleration lens arrangements have been developed using a so called vertical electrostatic energy filter (VEEF). Such techniques and systems provide for independent control of deflection and focus of an ion beam. These are disclosed in U.S. patent application Ser. No. 12/348,091 entitled Techniques for Independently Controlling Deflection, Deceleration, and Focus of an Ion Beam, and filed Jan. 2, 2009, and in U.S. patent application Ser. No. 12/647,950 entitled System and Method for Controlling Deflection of a Charged Particle Beam Within a Graded Electrostatic Lens, and filed Dec. 28, 2009, each of which is incorporated by reference herein in its entirety. The VEEF lens disclosed therein is a graded deceleration symmetric lens in which the electrodes are symmetrically positioned with respect to the central ray trajectory (CRT) of an ion beam so that the lens centerline coincides with the ion beam's centerline. A series of electrode pairs are located on opposite sides of the ion beam and are positioned such that the active part of an upper electrode is separated from the central ray trajectory by the same distance as its lower electrode counterpart.

In particular, in the symmetric VEEF system, deflection voltages $V_d$ to deflect the ion beam are applied equally to electrodes arranged above and below the beam, as detailed below. These voltages are given by $V_u = V_{crt} + V_d$ and $V_1 = V_{crt} - V_d$. This produces a deflection field of $V_d/g$, where g is the distance to the symmetric electrodes, $g_u = g_d$. In addition, deceleration and focus fields are superimposed onto the deflection field and are varied to accommodate beams with different energies or geometrical properties. As used hereinafter, the terms "VEEF," "lens," "VEEF lens," and "electrostatic lens" generally refer to a graded electrostatic deceleration lens that provides an angular deflection of a charged particle beam. The terms "symmetric" and "asymmetric" are used to distinguish between symmetric and asymmetric arrangements of electrodes, as discussed further below.

Although the symmetrical VEEF arrangement allows independent control of deflection and focusing fields, for many beam conditions, such as high perveance beams, that may require high deflection fields and high focusing fields, the necessary electrode voltages to produce such fields may be impractically large, and thus raise the risk of dielectric breakdown. Accordingly, the present invention is directed towards asymmetrical VEEFs. However, because many of the basic principles of symmetrical VEEF systems apply to the asymmetrical VEEF systems of the present invention, the discussion to follow begins with a description of some salient features of the symmetrical VEEF.

Figure 3:
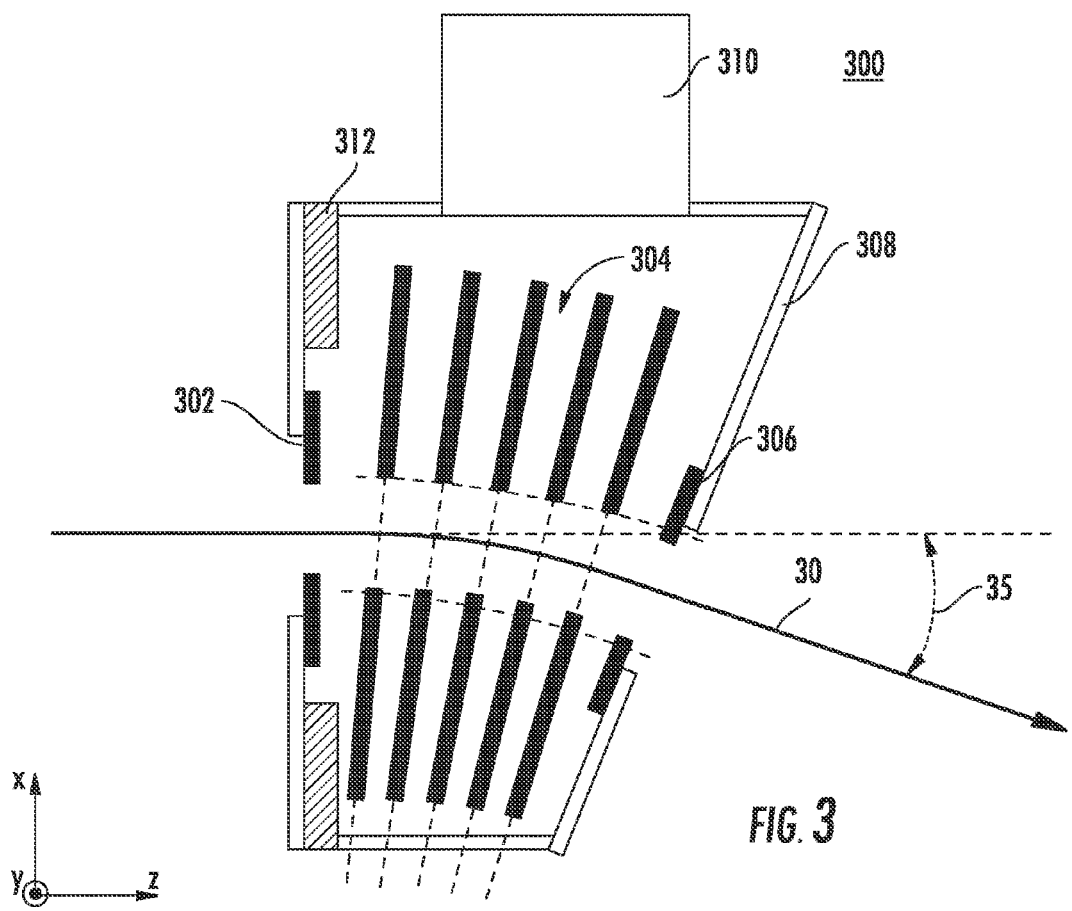
FIG. 3 depicts a side view of a symmetrical lens configuration.

FIG. 3 illustrates a side view of a VEEF 300 having a symmetrical configuration. As depicted in FIG. 3, the graded lens configuration 300 has several sets of electrodes, including a set of entrance electrodes 302, several sets of suppression/focusing electrodes 304, and a set of exit electrodes 306. Each set of electrodes provides a space/gap to allow an ion beam 30 (e.g., a ribbon beam) to pass therethrough. The electrodes (e.g., entrance electrode 302, suppression/focusing electrodes 304, and the exit electrode 306) are provided in a housing 308. A pump 310 may be directly or indirectly connected to the housing 308. The pump 310 may be a vacuum pump for providing a high-vacuum environment or other controlled environment. The housing 308 may include one or more bushings 312. These bushings 312 may be used to electrically isolate the housing 308 from other components.

As shown in FIG. 3, each set of entrance electrodes 302 and exit electrodes 306 may include two conductive pieces electrically coupled to each other or may be a one-piece structure with an aperture for the ion beam 30 to pass therethrough. Upper and lower portions of suppression/focusing electrodes 304 may have different potentials (e.g., in separate conductive pieces) in order to deflect the ion beam 30 passing therethrough. For simplicity, each set of electrodes may be referred to in singular. That is, the entrance electrodes 302 may be referred to as an "entrance electrode 302," the suppression/focusing electrodes 304 may be referred to as a "suppression/focusing electrode 304," and the exit electrodes 306 may be referred to as an "exit electrode 306." Although the graded lens configuration 300 is depicted as a seven (7) element lens configuration (e.g., with five (5) sets of suppression/focusing electrodes 304), it should be appreciated that any number of elements (or electrodes) may be utilized. For example, the graded lens configuration 300 may utilize a range of three (3) to ten (10) electrode sets. The ion beam 30 passing through the electrodes may include boron or other elements. Electrostatic focusing of the ion beam 30 may be achieved by using several thin electrodes (e.g., the suppression/focusing electrodes 304) to control grading of potential along an ion beam path or beamline 30. In the graded lens configuration 300, high deceleration ratios may also be provided while avoiding over-focusing. As a result, use of input ion beams 30 may be used in an energy range that may enable higher quality beams, even for very low energy output beams. In one example, as the ion beam 30 passes through the electrodes of the lens configuration 300, the ion beam 30 may be decelerated from 6 keV to 0.2 keV and deflected at 15° by the electrodes of the graded lens configuration 300. In this example, the energy ratio may be 30/1.

It should be appreciated that separating and independently controlling deceleration, deflection, and/or focus may be accomplished by: (1) maintaining symmetry of electrodes (e.g., the entrance electrode 302, suppression/focusing electrodes 304, and the exit electrode 306) with respect to a central ray trajectory ("CRT") of the ion beam 30, and (2) varying deflection voltages along the CRT of the ion beam 30 to reflect beam energy at each point along the CRT at a deflection angle 35. Symmetry of the electrodes with respect to the CRT of the ion beam 30 is where the ends of upper and lower electrodes closest to the ion beam 30 may be maintained at equal (or near equal) perpendicular distances from the CRT of the ion beam 30. For example, a difference in voltages on electrodes above and below the ion beam 30 (e.g., $V_{def}(z) = V_{upper}(z) - V_{lower}(z)$) may be configured so that a deflection component of the electric field (e.g., $(V_{upper}(z) - V_{lower}(z))/\text{gap}(z)$) may be a fixed ratio/factor of the beam energy at that point (which may vary along the electrodes or lenses) (e.g., factor*$E_{beam}(z)$). For example, this may be expressed as Equation 1 below:

$$V_{def}(z)/\text{gap}(z) = \text{factor}*E_{beam}(z) \qquad \text{Eq. 1}$$

Figure 4:
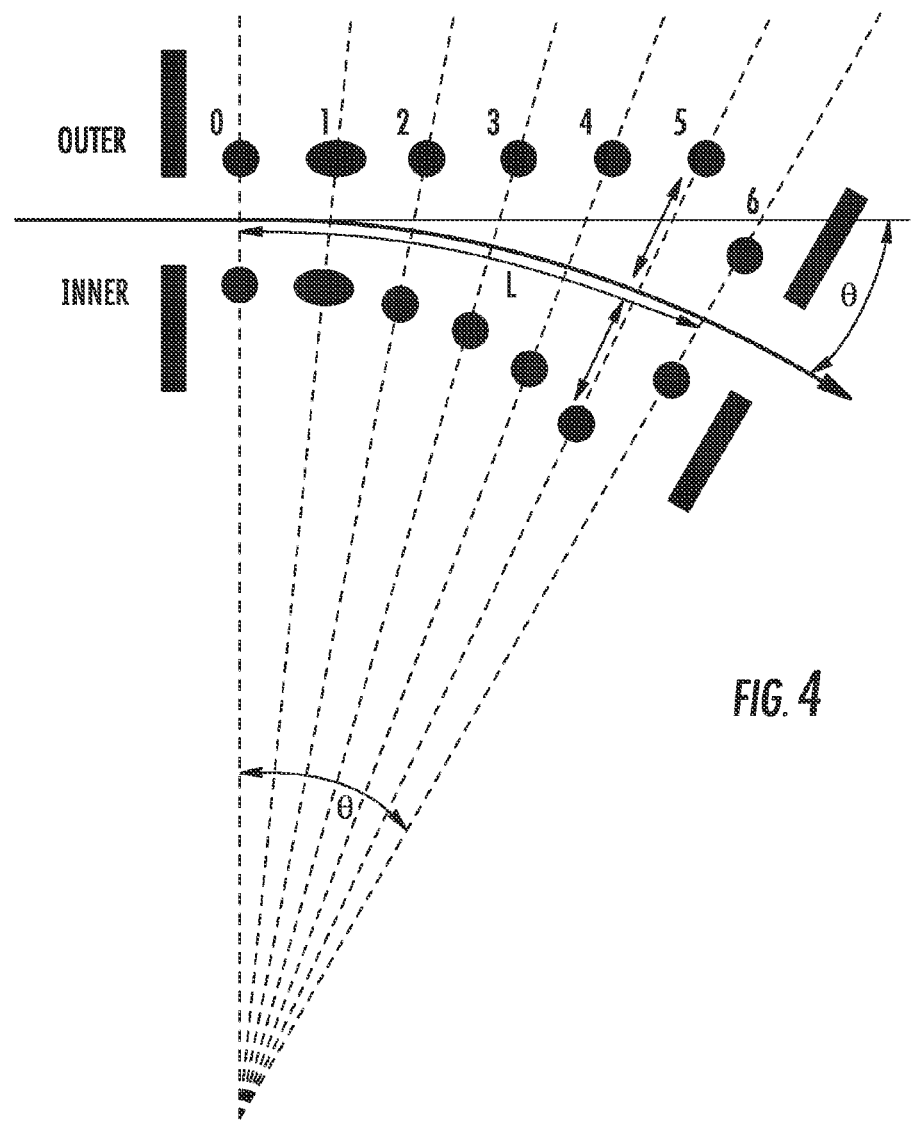
FIG. 4 is a geometric representation of an exemplary graded lens configuration.

The symmetrical VEEF illustrated in FIG. 3 is capable of independently decelerating and deflecting an ion beam. Further details of a symmetrical VEEF electrode configuration are provided in FIG. 4, which illustrates 7 inner and outer electrodes (numbered 0 through 6), centered about a 20-degree deflection arc θ. In this example, the positions of the electrodes are fanned (so that high energy neutrals from the input beam will not hit the high voltage electrodes), and the angular spacing of the electrodes is uniform. The first electrodes "0" (inner and outer) are tied to the upstream (high energy) beamline, and the last electrodes "6" (inner and outer) are tied to the downstream (low energy beamline). The difference in potential between the upstream and downstream beamlines is the deceleration voltage of the lens. The difference in voltage between the inner and outer electrodes (at a particular position along the deflection arc) is proportional to the energy of the beam's CRT at that point. The constant of proportionality between the deflection voltage difference and the CRT energy is referred to as the deflection factor $F_{defl}$.

Figure 5:
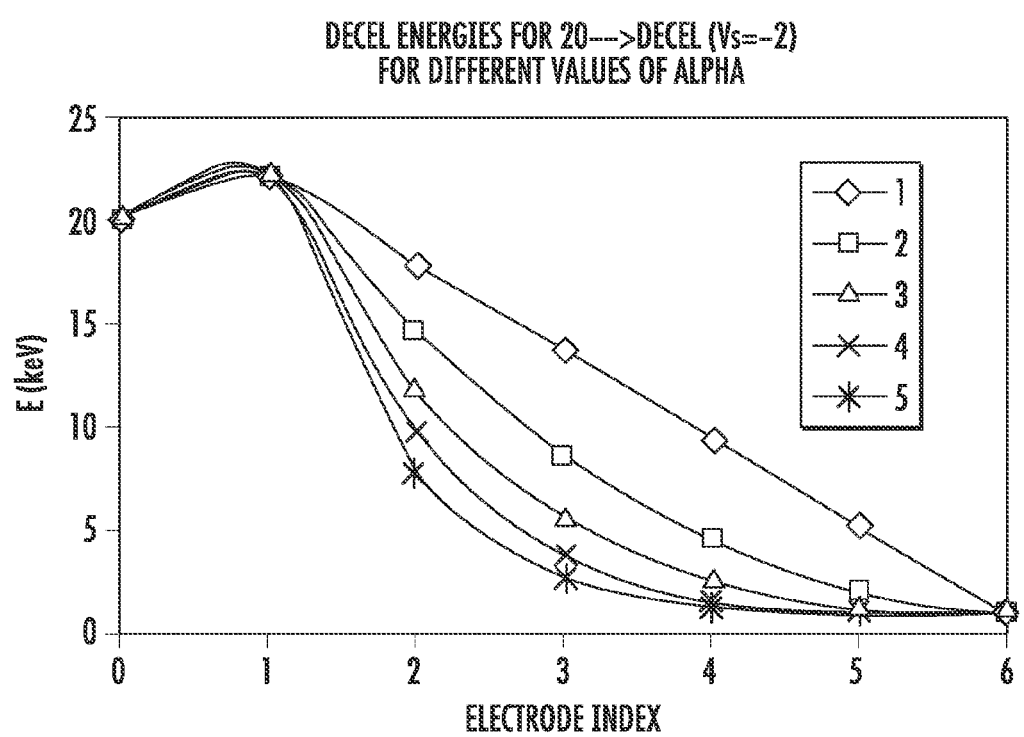
FIG. 5 is a graph of ion beam energy vs. electrode position for the graded lens of FIG. 4.

The first electrode not tied to the input beamline (numbered 1 in FIG. 4) is known as a suppression electrode, as it suppresses upstream beam plasma electrons from being stripped from the beam. Between this suppression electrode and the final ground electrode, the energy of the beam is reduced according to the potentials on the electrodes 2-5. This grading of the deceleration field affects the net focus of the beam, as well as the residual energy contamination (EC). The grading is described by a power law, embodied by a single parameter, alpha, as defined by Eq. 2 below.

$$E_{crt}(0) = E_0 \qquad \text{Eq. 2}$$

$$E_{crt}(i = 1\ldots6) = E_f + (E_0 - E_f + eV_s)\left(\frac{(6-i)}{5}\right)^\alpha$$

where i=index describing the location along the lens, $E_{crt}$=Energy of ions on the CRT at each point I, $E_f$=final energy of the beam, $E_0$=initial energy of the beam, $V_s$=potential on the crt at the location of the suppression electrode, and e=charge of electron. Thus, from Eq. 2, if α=1, the energy of the ions on the crt varies linearly from $E_0+eV_s$ to $E_f$, whereas if α>1, the energy drops more quickly, as exemplified in FIG. 5. In general, a large α decelerates the beam quickly, reducing the chance of high energy neutralized ions from reaching the wafer (i.e. resulting in low EC) while a small α results in greater focusing of the beam.

Figure 6:
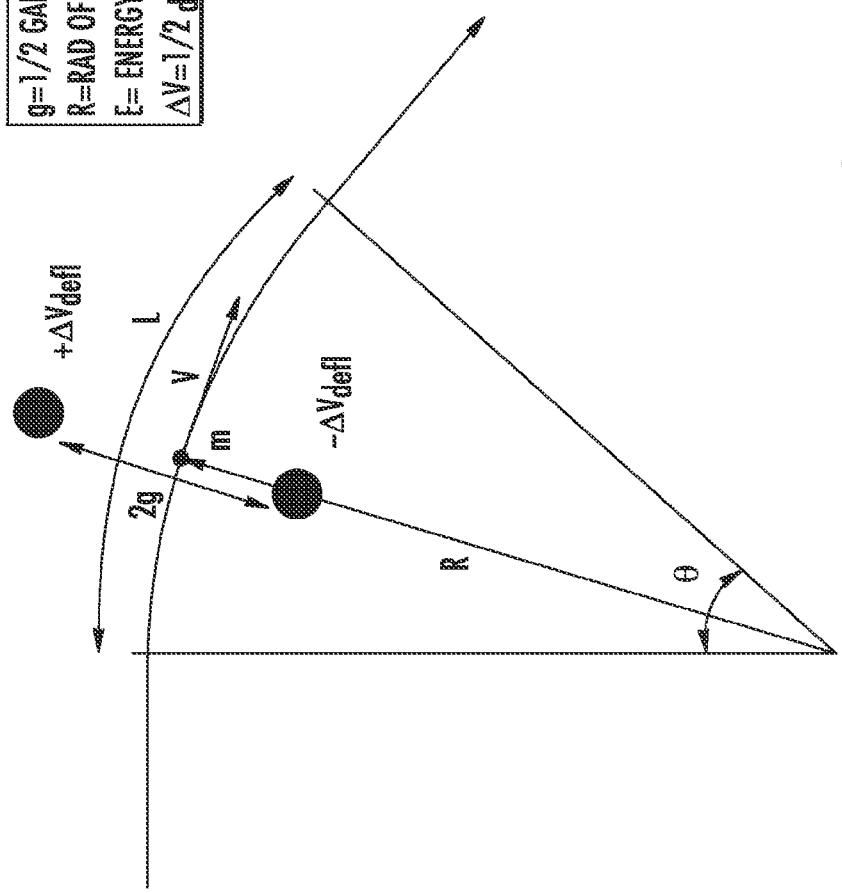
FIG. 6 is a geometric representation of arcuate motion of an ion beam produced by the graded lens of FIG. 4.
Figure 6:
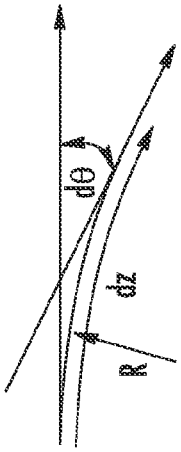

FIG. 6 depicts geometrical details of arcuate motion in an ideal symmetric VEEF arrangement. The difference in voltage between the inner and outer electrodes provides an electric field perpendicular to the particle's motion, therefore producing a localized circular, or arcuate motion. The radius of curvature and length of the arc (and therefore the net deflection angle) must conform to the geometry of the lens in order for the beam to remain centered between the inner and outer electrodes, thereby minimizing aberrations and the coupling between focus and deflection. If $F_{defl}$ is constant over the length of the VEEF, the beam's central ray trajectory (CRT) would be perfectly circular, resulting in a net deflection angle θ over its length L.

Accordingly, in a symmetric VEEF arrangement, a series of inner and outer electrode pairs can be placed along a series of radii that are spaced to provide an arc corresponding to the desired deflection angle θ for the electrostatic lens. U.S. patent application Ser. Nos. 12/348,091 and 12/647,950 provide further details of methods for controlling deflection, deceleration, and focus of charged particle beams using arrangements, such as a symmetric VEEF.

Using the symmetric VEEF arrangement described above, it may be desirable to provide a large separation between opposing electrodes. For example, a greater electrode separation helps the beam avoid striking the electrodes as it is deflected through the VEEF lens. However, increasing the spatial separation of opposing electrodes requires an increase in electrode voltage to maintain the required electrical field strength for proper beam operation, which may exceed the electrode voltage limits for stable operation of the electrodes, as noted above.

Figure 7:
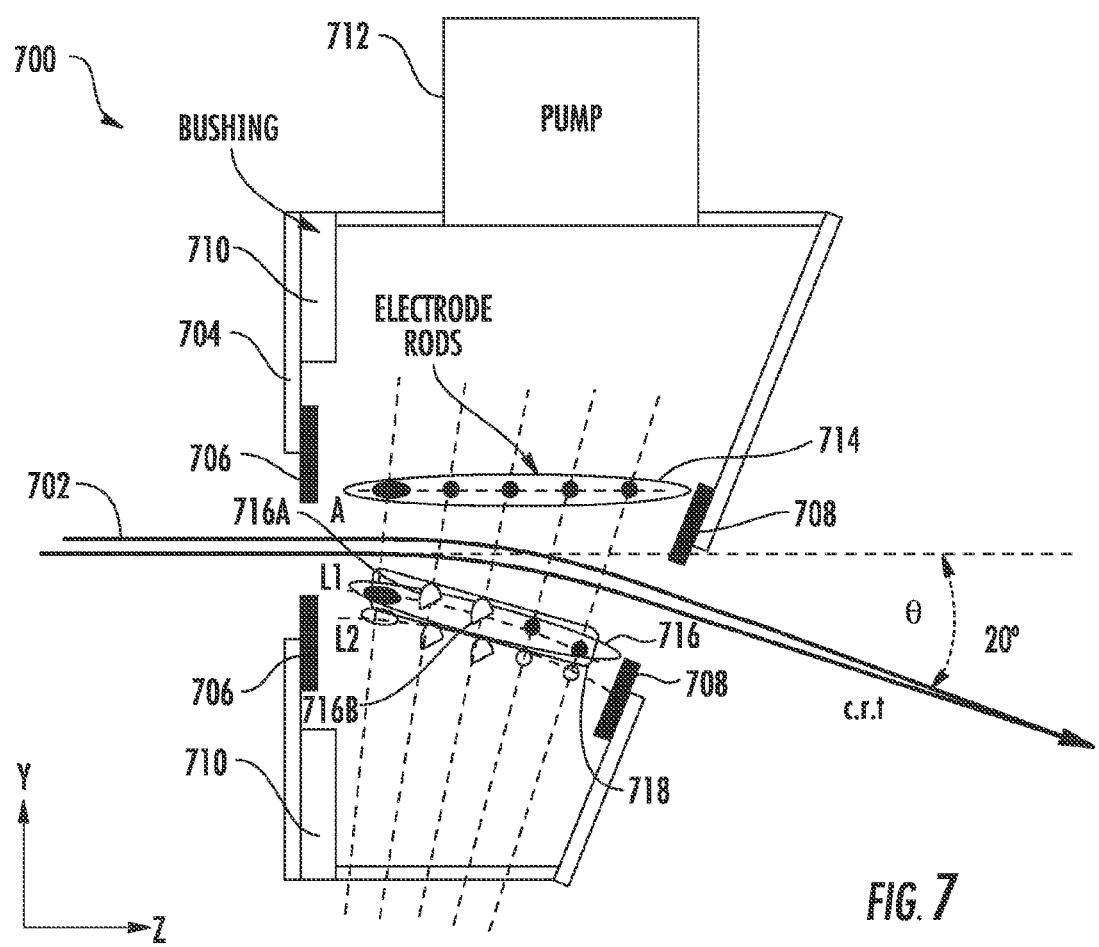
FIG. 7 presents a schematic cross-section of an exemplary asymmetric lens.

FIG. 7 presents an asymmetric VEEF 700 that addresses this issue by providing an asymmetric arrangement of electrodes that facilitates operation at reduced electrode voltages as compared to symmetric VEEF arrangements for a given electric field strength. VEEF 700 may be a deceleration lens that decelerates an ion beam 702 while deflecting the beam through a deflection angle Θ as it passes through the lens in the direction indicated by the arrow. Lens 700 may also provide focusing of ion beam 702. Lens 702 may comprise a housing 704, entrance apertures 706, and exit apertures 708. Arrow 702 is used to represent an ion beam, but may represent a CRT of beam 702, and is deflected through an angle Θ of 20 degrees in the example illustrated in FIG. 7. However, Θ may have other values that are smaller or greater than 20 degrees.

Lens 700 may also include bushing 710 and pump 712, which may be directly or indirectly connected to the housing 704. The pump 712 may be a vacuum pump for providing a high-vacuum environment or other controlled environment. Bushings 710 may be used to electrically isolate housing 704 from other components. Lens 700 includes a set of upper electrodes 714, which may be mutually arranged along a straight line, as depicted in FIG. 7. A set of lower electrodes 716 is provided, such that each upper electrode has a corresponding lower electrode. Asymmetric VEEF 700 operates similarly to the symmetrical VEEF depicted in FIG. 4 and discussed above. Voltages may be supplied to each electrode 714, 716 to define the deceleration and deflection fields and to focus ion beam 702. The difference in voltage between the inner and outer electrodes (at a particular position along the deflection arc) may be arranged to be proportional to the energy of the beam's CRT at that point in order to maintain a constant deflection factor $F_{defl}$.

Unlike the case of a symmetric VEEF, the set of lower electrodes 716 is arranged closer to the CRT 702 than corresponding upper electrodes 714. The phrase "set of electrodes is arranged closer to the CRT" refers to the fact that at least one, preferably more than one lower electrode 716 is disposed closer to CRT 702 than a corresponding upper electrode 714. In the example illustrated in FIG. 7, all lower electrodes 716 are arranged closer to CRT 702 than their upper electrode counterparts. As with the symmetric VEEFs discussed above, each lower electrode may form a pair with a corresponding upper electrode. In the embodiment illustrated in FIG. 7, a lower electrode and corresponding upper electrode are disposed along a common radius at a different point along a curve that is formed by the placement of the lower electrodes. By arranging electrodes 716 at positions closer to CRT 702, for a given field strength along radii between upper and lower electrodes, voltage applied to electrodes 716 is lower than for a symmetrical electrode arrangement, represented by the open circles along curve L2 below electrodes 716. Accordingly, as set forth in detail below, in some embodiments VEEF 700 may provide the same electric fields as symmetrical VEEF using lower electrode voltages.

In other embodiments, VEEF 700 may be employed to provide stronger electric fields compared to a symmetrical VEEF using electrode potentials no greater than those applied to electrodes in the symmetrical VEEF. In other words, since the distance between upper and lower electrodes is reduced in VEEF 700, a higher strength field can be produced using the same voltages on upper and lower electrodes as that used in a symmetrical electrode arrangement illustrated by the open circles of FIG. 7. This may be useful, for example, in providing better beam focusing for a given set of electrode voltages.

Although the electrode separation between corresponding upper and lower electrodes generally increases from the entrance 706 to exit 708 apertures in the embodiment depicted in FIG. 7, a final pair of electrodes located near the exit aperture may be disposed at a closer separation between top and bottom electrodes as compared to their neighboring electrodes. This latter arrangement (shown in FIG. 4 for a symmetrical VEEF) is useful to control electric field termination and the plasma boundary.

While FIG. 7 depicts an asymmetric VEEF in which the upper electrodes are arranged in an "in-line" fashion, other arrangements may be used in accordance with the present invention that still achieve a closer placement of lower electrodes to the beam CRT as compared to the upper electrodes. One advantage of the in-line configuration for top electrodes shown in FIG. 7 is that it reduces contamination induced by energetic neutrals. Energetic neutrals have been identified by the present inventors as a contributory mechanism for energy contamination (EC) in electrostatic lenses. As is well known, ionized species in an ion beam may become neutralized. For ions approaching or located inside a deceleration and/or deflection lens, such as a VEEF, once neutralization takes place the now-neutral particle is no longer subject to electric fields. The energetic neutral, may, for example, be neutralized near the entrance aperture and retain an energy similar to incident ion energy before entering the deceleration lens, such as 10-30 keV in the case of an ion beam having 30 keV initial energy and entering into a graded deceleration lens that outputs a final energy of 10 keV. Because it is not subject to the deceleration fields, the energetic neutral may travel with the same kinetic energy until striking an object. Since deflection fields do not act upon the energetic neutral, the neutral may continue to propagate in a straight line until encountering an object located along its path of travel. In the case of symmetrical VEEF electrodes, if the upper electrodes are arranged along an arcuate path the upper electrodes provide a likely target for an energetic neutral (see FIG. 3). These energetic neutrals may be reflected through an exit aperture and onto a wafer being processed by the ion beam, presenting a source of energy contamination in the wafer, since the exact energy of the neutrals, may vary substantially and is typically larger than the nominal implantation energy.

By employing an in-line configuration of upper electrodes, the embodiment of the invention depicted in FIG. 7 provides less of a target for energetic neutrals traveling through VEEF 700. For example, ions that are neutralized at position A may have a direction of travel generally parallel to the row of upper electrodes 714. Accordingly, the neutrals may not encounter upper electrodes 714 and are less likely to be reflected outwardly toward a wafer. Additionally, lower electrodes 716, even in the asymmetric configuration, are arranged so as to diverge from CRT 702, thereby providing less target to any ions that may become neutralized while traveling along CRT 702. For this reason, lower electrodes 716 may be arranged more closely to CRT 702 without risk of producing extra EC due to collisions between energetic neutrals and electrodes.

In exemplary embodiments, the separation between upper and lower electrodes may be about 50 to 100 mm near the entrance aperture and may be about 100 to 200 mm near the exit aperture. In some embodiments, lower electrodes 716 may be arranged to be about 5 mm to 25 mm closer to CRT 702 than are upper electrodes 714, for example, 13 mm closer.

Figure 8A:
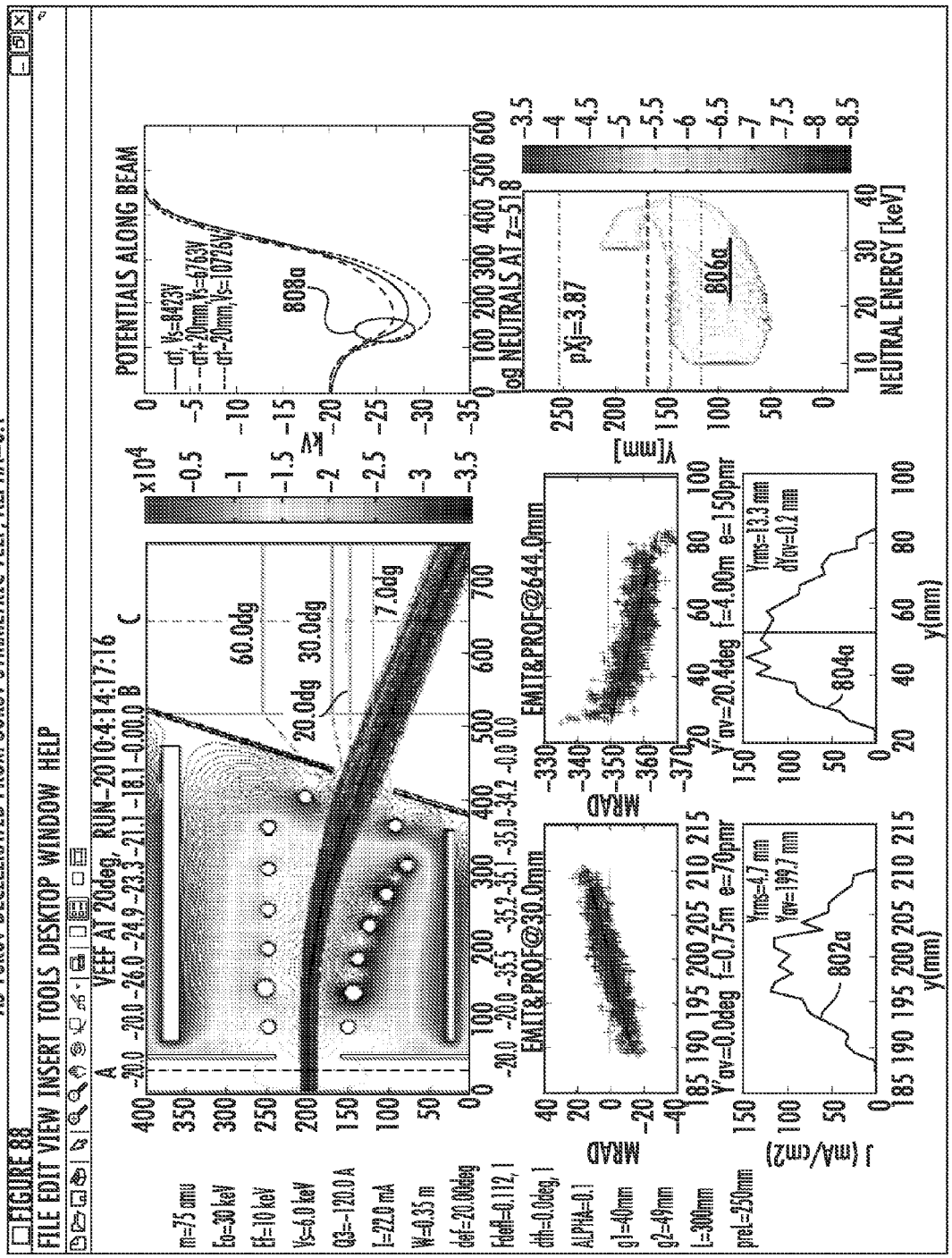
FIGS. 8A and 8B are simulation results that illustrate a comparison of voltage parameters and simulated performance between a symmetrical arrangement and an exemplary asymmetrical arrangement.
Figure 8B:
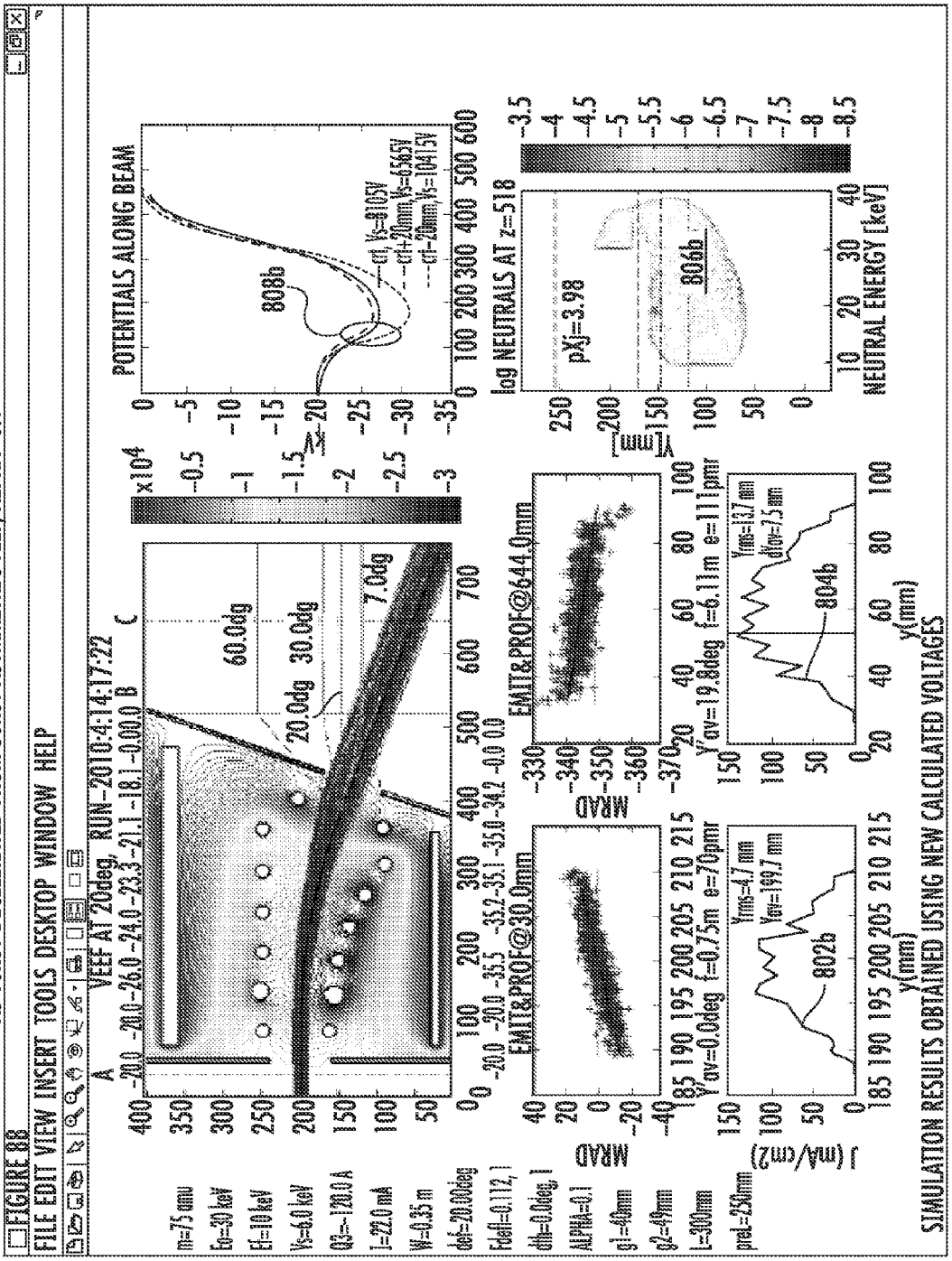

FIGS. 8a and 8b together illustrate a comparison of VEEF voltage parameters and simulated performance between a symmetrical arrangement and an asymmetrical arrangement of seven electrode pairs, in the case of an arsenic ion beam having initial energy of 30 keV and an exit energy of 10 keV. In both symmetrical (FIG. 8a) and asymmetrical (FIG. 8b) arrangements, α is set to equal 0.1, which indicates a highly focused beam. Likewise, the voltages on the upper electrodes in the symmetrical arrangement are the same as the corresponding values in the asymmetrical arrangement, and both sets of upper electrodes are arranged in an in-line configuration. Moreover, the electrode voltages are designed to deflect the CRT through a 20 degree angle in both cases.

In the symmetrical electrode configuration, the spacing between upper and lower electrodes in the initial electrode pair is about 80 mm and increases to about 160 mm for the next-to-last pair. In the asymmetrical electrode configuration, the spacing between upper and lower electrodes in each pair is about 13 mm less than that of the corresponding symmetrically arranged pair. Accordingly, in the asymmetrical arrangement, the lower electrode is spaced about 27 mm from the CRT at the first electrode position, while the upper electrode is spaced about 40 mm from the CRT.

In each case, the beam current profile is taken at a point Z=30 mm, represented by point A, just before the beam enters the lens, as well as at a point Z=644 mm, represented by point C, and well outside the lens after decelerating and being deflected through a 20 degree angle. In both VEEFs, as shown in curves 802a and 802b, an initial –20 mm diameter beam is centered in the entrance aperture at ~Y=200 mm. The downstream beam diameter at Z=644 mm, depicted in curves 804a, 804b, is about 60 mm in both VEEFs. A comparison of plots 806a and 806b illustrate a similar energetic neutral profile between both arrangements. Finally, curves 808a and 808b illustrate a that beam energy and the beam energy profile between positions that are 20 mm displaced from the CRT varies similarly along the Z direction for both the symmetric and asymmetric VEEF arrangements. Accordingly, the asymmetric VEEF arrangement produces very similar focusing as the symmetric VEEF arrangement given the same voltages applied to the upper electrodes.

Figure 10:
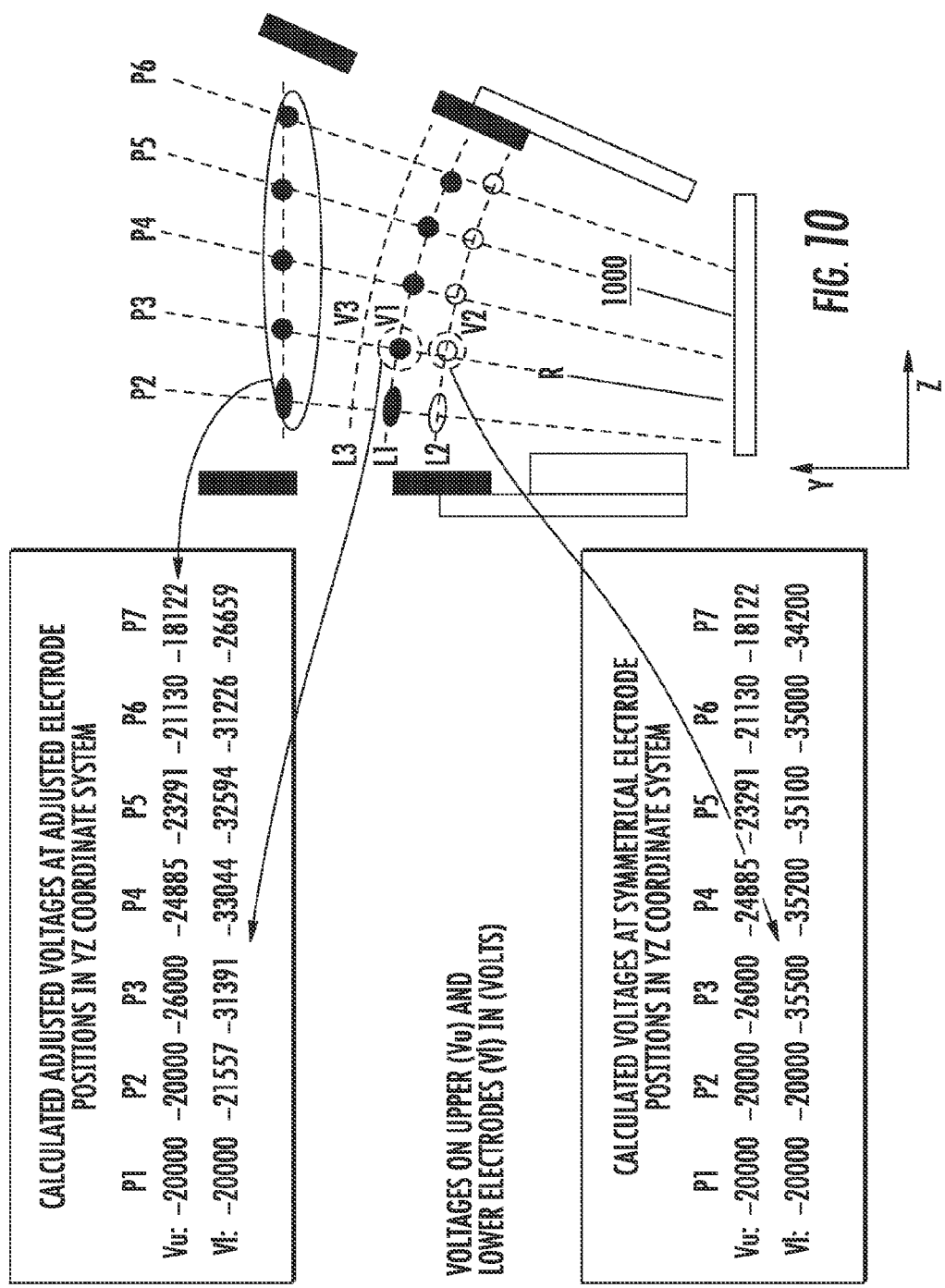
FIG. 10 illustrates an exemplary map for calculating potentials, as well as exemplary electrode voltages.

FIGS. 8a and 8b also show the voltages applied to the lower electrodes for the symmetric and asymmetric configurations, respectively (see also FIG. 10). The voltages at the first electrode positions are both –20 kV. However, at positions 3-7, the voltages in the symmetrical configuration average about –35 kV, while those in the asymmetrical configuration average about –kV. Thus, the asymmetric VEEF configuration of the present invention provides similar beam focusing performance at substantially lower operating voltages for the arsenic beam decelerated from 30 kV to 10 kV and deflected through 20 degrees.

In view of the above example it will be apparent that, for a given set of beam performance criteria (such as focusing, deflection angle, amount of beam deceleration), a reduction in voltage required on the lower electrodes may occur as the lower electrodes are moved closer to the beam CRT. Referring again to FIG. 7, because the lower electrodes 716 are not likely to lie in the path of energetic neutrals, the lower electrodes may be spaced substantially closer to the CRT than upper electrodes 714 without substantially increasing encounters with energetic neutrals. To produce a given performance, the reduction in voltage required for the lower electrodes may be extended by moving the set of lower electrodes relatively closer to the beam CRT up to a point where beam function is impaired due to other mechanisms. Using the example of FIGS. 8a and 8b, for a 20 mm diameter incident ion beam, and an 80 mm separation of the first set of electrodes in the symmetrical configuration, it may be possible to move the position of lower electrodes about 20 mm closer to the beam CRT in an asymmetric configuration, thereby being about 10 mm from the beam edge near the entrance to the VEEF. However, aberration effects near the beam boundary place a limitation on the proximity of lower electrodes 716 to CRT 702, which may be determined empirically or by simulation. In addition to aberrations, a skew in the vertical beam distribution (typically Gaussian in shape) may occur. Vertical angle distribution may also be affected by the skew in the beam profile. Thus, a beam-electrode separation of 5 mm may be too small for proper operation.

In addition to providing similar performance at reduced voltages as compared to symmetric VEEF configurations, the asymmetric VEEF configuration provides for improved performance over symmetric VEEFs at similar electrode voltages. In one implementation of the invention, the asymmetric configuration may be used to achieve deflection fields that may not be practical using a symmetric VEEF configuration. In other words, a set of lower electrodes may be positioned as in FIG. 8b, while maintaining high voltages on the lower electrodes, such as those shown for symmetrically positioned lower electrodes in FIG. 8a. In this manner, substantially larger deflection fields can be realized, since the same voltage drop between upper and lower electrodes occurs over a smaller separation in the asymmetric configuration.

In one configuration of the invention, a lower set of electrodes in a VEEF are operable to move between a plurality of positions. For example, electrodes 716 may be operable to move between positions L1 and L2, represented by the dashed lines. The set of lower electrodes may be operable to move between a first set of positions that establishes a symmetrical VEEF configuration, and a second set of positions that establishes an asymmetrical VEEF configuration. The lower electrodes may be disposed on an actuated chassis 718 that moves the lower electrodes in unison.

The ability to move lower electrodes to different positions provides flexibility in beam processing. For example, for beams that do not require very high electrode voltages the lower electrodes 716 may be positioned further from the CRT to optimize energy purity and avoid aberrations that may take place when the beam is too close to the electrodes. When using high space charge beams that require strong focusing or high energy beams that require strong electrical fields to deflect though the required deflection angle, the lower electrodes 716 may be positioned closer to the CRT.

Alternatively, at least some of the lower electrodes may be operable to move independently of other lower electrodes. For example, referring again to the symmetrical electrode arrangement depicted in FIG. 4, in accordance with the present invention, the lower electrode at position 6 may be fixed while lower electrodes at positions 0-5 may be movable, wherein they may be disposed closer to the CRT than the upper electrodes.

Lower electrodes 716 may be configured to rotate along an axis that is perpendicular to the direction of the CRT 702. Electrodes 714, 716 may be rod shaped such that the rod axis is disposed orthogonal to the direction of beam 702. The cross section of electrodes 714, 716 may be circular, elliptical, or another shape and may vary in shape among the different electrodes (as depicted in FIG. 7). The lower electrodes in particular may have a non-circular cross-section, such as an oval or cam shape, which allows the top surface of the electrode to rotate between positions that are at varying distances from the CRT 702, as illustrated by the electrodes 716A, 716B that are rotatable cams. Lower electrodes 716 having an oval, cam or other eccentric shape, may be configured to rotate independently of one another, thereby providing the ability to independently vary the distance between the electrode surface of the lower electrode and the CRT at each electrode position. In this manner, the deflection angle and beam focus may be adjusted. For example, when the electrodes are rotated to new positions, the beam CRT may be allowed to move. In this case, an approximate voltage distribution can be applied by reducing the $F_{defl}$ and/or adjusting the alpha parameter. In another embodiment the electrode positions may be adjusted without modifying the focusing voltages (alpha parameter) while still applying the deflection field correction.

In other configurations of the invention, a set of upper electrodes may be operable to move between different positions.

Figure 9:
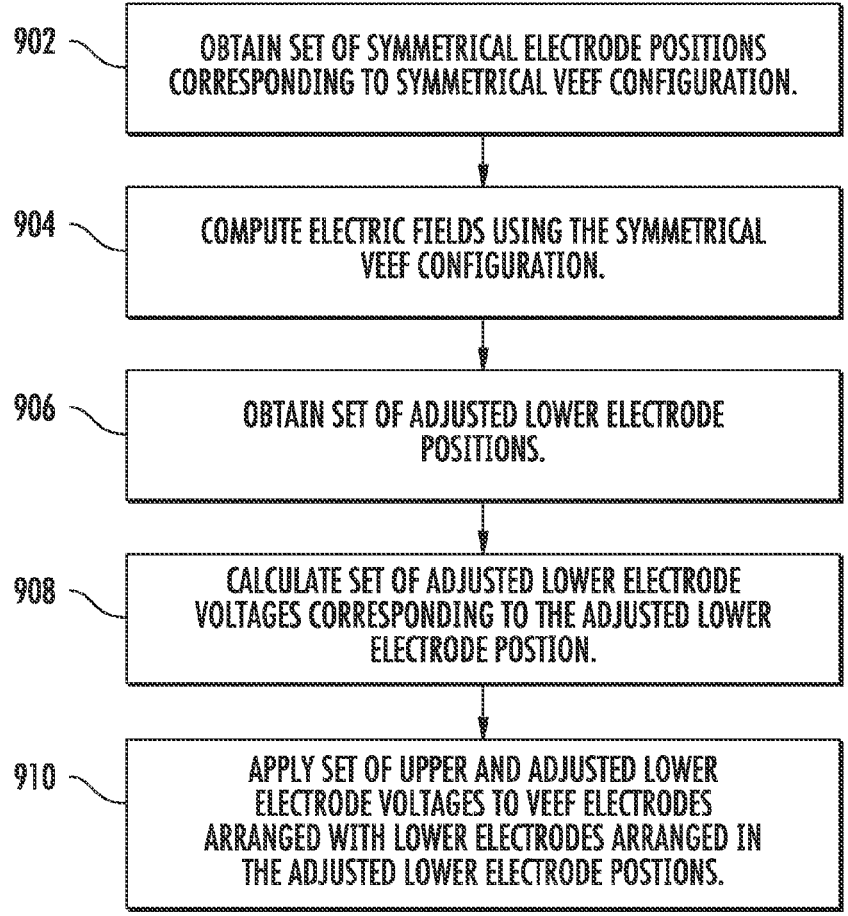
FIG. 9 shows exemplary steps involved in a method for controlling a charged particle beam.

FIG. 9 shows exemplary steps involved in a method for controlling a charged particle beam. At step 902, a set of symmetrical electrode positions is obtained. Referring to FIG. 8a, a set of upper electrode positions and lower electrode positions that define a symmetrical VEEF configuration may be obtained from a simulation or from a known design. For example, a user may wish to modify an existing VEEF design that employs a symmetrical arrangement of electrodes.

At step 904, an electrostatic model is used to compute electric fields using the symmetrical VEEF configuration obtained in step 902. This step may be performed using a computer model that calculates two-dimensional electrostatic fields, with accounting for the beam plasma boundary. Exemplary two dimensional computer generated fields are illustrated in FIGS. 8a and 8b. The computed fields may be based upon beam requirements, such as voltages necessary to achieve a needed focusing. The computed electric fields may produce a CRT that is symmetrically positioned with respect to the upper and lower electrodes of the symmetrical VEEF configuration when the beam is deflected through the nominal deflection angle of the VEEF. This nominal angle may be the angle between incident ion beam and exiting ion beam that obtains when the CRT exits at a center of the exit aperture.

At step 906, a set of adjusted lower electrode positions is obtained. The set of adjusted lower electrode positions and the set of upper electrode positions may define an asymmetric VEEF configuration. The adjusted lower electrode positions provide lower electrodes that are located closer to the CRT than upper electrodes when the CRT is deflected through the nominal deflection angle, as illustrated at FIG. 7. Considerations for determining the adjusted lower electrode positions include the need to maintain low aberration and low EC, as well as the need to prevent skew in vertical beam distribution.

At step 908 a set of adjusted lower electrode voltages corresponding to the adjusted lower electrode positions is calculated. Based upon the computed electric fields determined in step 904, an axial potential distribution in the VEEF system may be calculated along any particular radius. FIG. 10 illustrates generally a two dimensional map for electrode positions disposed along five different radii P2-P6. These may correspond, for example to positions of electrodes used in the simulations depicted in FIGS. 8a and 8b for deceleration of 30 keV As beams (without the first and last set of electrodes shown). The tabular data of FIG. 10 corresponds to the electrode voltage at seven different sets of electrode positions, as depicted in FIGS. 8a and 8b, shown for both asymmetrical and symmetrical configurations. As can be seen, the calculated adjusted voltages at the adjusted lower electrode positions are much lower than the calculated lower electrode voltages for the symmetrical configuration.

In the exemplary map of FIG. 10, an upper and lower electrode at position P3 lie along a radius R, for which a series of potentials V1, V2, V3 may be determined, at positions, where the radius intercepts curves L1, L2, and L3. The latter curves, in turn, may represent specific distances. Based on the potential map along R, the voltage at any position along R can be calculated, so that the voltage corresponding to lower electrode located along R can be determined, once the Y-Z coordinates of the electrode are specified. In the example depicted in FIG. 10 for electrode position P3, the lower electrode in question is located where curve L1 intercepts R. Accordingly, the voltage assigned to the lower electrode at the adjusted electrode position may be V1. In cases where the coordinates of the electrode lie at Y-Z coordinates where a corresponding potential has not been mapped, the potential may be determined by any convenient technique, such as a mapping function. As is evident, the voltage V1 (−31,391) is much lower than the corresponding voltage V2 (−35,500) for the symmetrical arrangement. Similar results are evident for positions P4-P7 (position P7 is not shown in the two dimensional map).

At step 910 the set of upper and adjusted lower electrode voltages may be applied to VEEF electrodes arranged with upper electrodes in the upper electrode configuration and lower electrodes arranged in the adjusted lower electrode positions.

The methods described herein, such as the aforementioned steps of FIG. 9, may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

The methods of the present invention, such as the method of FIG. 9, may be employed in various ways to provide an improved combination of deceleration, focusing, and deflection of ion beams. For example, it may be desirable to provide an electrostatic lens that can operate effectively for a wide variety of ion beam conditions ranging, for example, from high energy to relatively low energy. Accordingly, in embodiments of the invention, the method of FIG. 9 may be employed with a VEEF system in which a lower set of electrodes is movable, as described above with respect to FIG. 7. Thus, for low energy beams, or beams requiring less focusing, the movable electrodes may be employed in a first set of positions that provides a symmetrical electrode configuration. To use the same VEEF system with high energy beams, the lower electrodes may be moved to a second set of electrode positions. The electrode voltages for the second set of electrode positions may then be calculated according to the method of FIG. 9. These voltages may then be applied to the new electrode configuration when using high energy beams.

Alternatively, the steps set forth in FIG. 9 may be employed to design an asymmetric VEEF arrangement having fixed electrodes where the fixed electrode design may be adapted from a symmetrical VEEF configuration for dedicated use with demanding beam conditions, such as high energy, high perveance beams, where high deflection fields are necessary.

Figure 11:
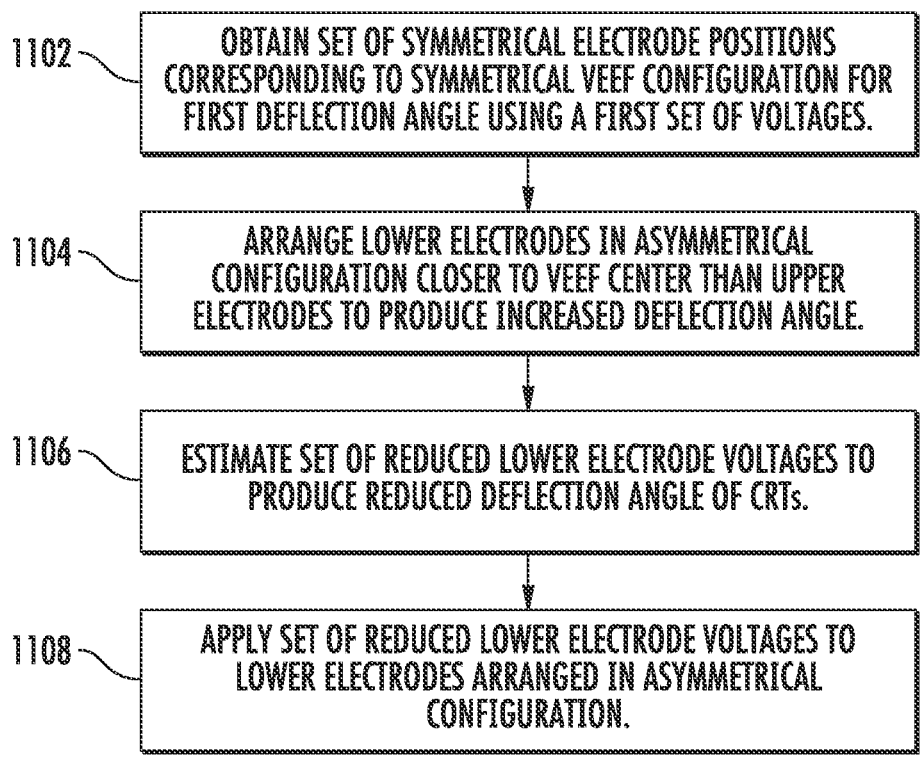
FIG. 11 shows exemplary steps involved in another method for controlling deflection of a charged particle beam.

FIG. 11 depicts exemplary steps involved in a method for controlling deflection of a charged particle beam, according to a further embodiment. Since the required deflection fields are higher for higher beam energies, the beam energy used in the symmetrical VEEF configuration may be limited by the maximum voltage that can be safely applied to the lower electrodes. Accordingly, VEEF operation under a first set of conditions, for example, low beam energy conditions, may be satisfactory since the necessary voltages applied to the lower electrodes to achieve required deflection and focusing are not excessive using the symmetrical VEEF configuration. If operation under a second set of conditions, for example, high beam energy conditions, is subsequently required, the method of FIG. 11 provides a convenient means to adjust the beam behavior without resorting to extensive computer modeling.

At step 1102, similarly to step 902, a set of symmetrical electrode positions is obtained that corresponds to a symmetrical VEEF configuration. In the symmetrical VEEF configuration, a CRT of an ion beam is guided through a first deflection angle using a first set of voltages. This deflection angle may correspond to the condition where the CRT travels along a centerline of the lens and exits the VEEF in the center of the exit aperture and impinges on a process wafer at a desired position on the wafer.

Figure 12:
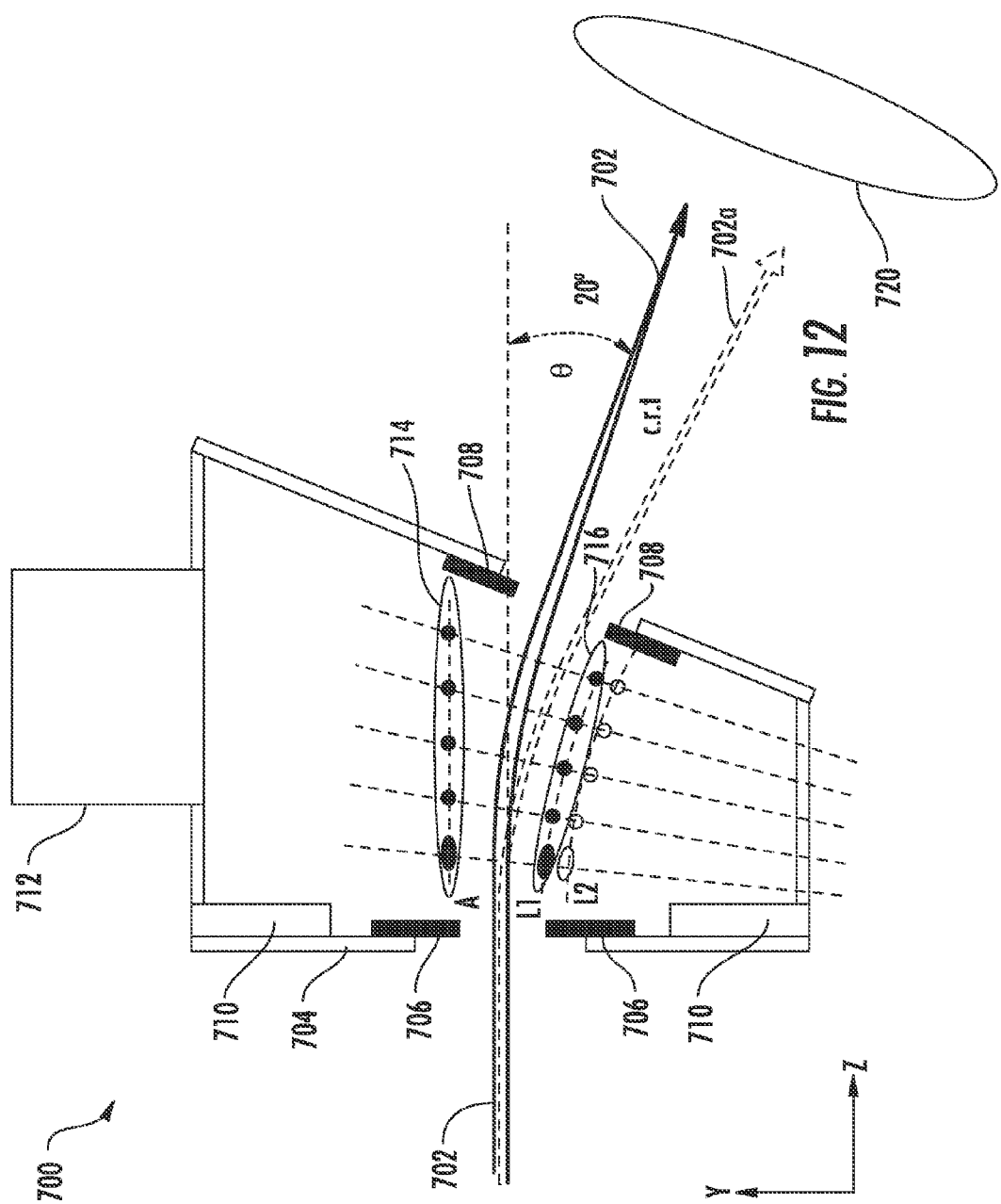
FIG. 12 is a depiction of the lens of FIG. 7 that illustrates aspects of an exemplary method.

At step 1104, the lower electrodes are arranged in an asymmetrical configuration closer to VEEF center than upper electrodes. For example, in a VEEF that includes movable lower electrodes, a set of shifted positions may be selected that are closer to the centerline of the lens, and signals may be sent to a mechanism that moves the lower electrodes to the set of shifted positions. In this manner, for a given set of electrode voltages, the CRT of the ion beam is deflected through an increased deflection angle that brings the CRT closer to the lower electrodes after the electrodes are moved toward the lens centerline. FIG. 12 illustrates the scenario in which the voltages on the upper electrodes 714 and lower electrodes 716 may be fixed, while the lower electrodes are moved between positions. For a first set of positions of lower electrodes 716, which correspond to a symmetrical configuration along curve L2, the lower electrode and upper electrode voltages are set to deflect CRT 702 along a centerline of the lens through and angle θ. When the lower electrodes are adjusted to asymmetrical positions along curve L1, without changing the electrode voltages, the CRT is deflected along a path 702*a* that defines a larger deflection angle.

At step 1106, a set of reduced lower electrode voltages is determined in order to produce a reduced deflection angle of the CRT. The approximate voltage distribution for the lower electrodes may be determined without the use of computer code. The values for the reduced lower electrode voltages may be determined by estimating the value of the deflection field that would reduce the deflection angle of the CRT to a desired value. For example, referring again to the example of FIG. 12, it may be desirable to reduce the deflection angle to an angle between that formed by CRT 702*a* and CRT 702. The range of acceptable deflection angles for the CRT may be constrained by the requirement that the exiting ion beam impinge upon a wafer 720 to be processed at a desired angle, such as 90 degrees and at a desired portion of the wafer, such as the central portion. As noted hereinabove, if the deflection factor $F_{defl}$ is constant over the length of a VEEF, the CRT would follow a circular arc, resulting in a net deflection angle θ over its length. In accordance with the present embodiment, a reduced deflection factor for the asymmetric configuration may be estimated based upon the decreased separation between upper and lower electrodes in the asymmetric configuration and the value of the deflection fields in the symmetric arrangement. The reduced deflection factor is then used to estimate voltages to be applied to the shifted lower electrodes in order to reduce the CRT deflection angle to within the range of acceptable values. The estimated voltages need not be determined so precisely that $F_{defl}$ is constant over the entire length of the CRT path through the VEEF, so long as an average deflection constant produces the desired deflection angle.

At step 1108, the set of reduced lower electrode voltages may be applied to the lower electrodes arranged in asymmetrical configuration, in order to deflect an ion beam according to a desired geometry.

The methods and systems of the present invention set forth hereinabove make use of the inherent asymmetry in a beam deflected through a VEEF system. Because energy contamination may result from neutral interactions with upper electrodes, but is less likely to be caused by interactions with lower electrodes, the present invention provides means for controlling beam properties in a VEEF by manipulating the positions and voltages on lower electrodes. By providing an asymmetric configuration in which lower electrodes are closer to the lens centerline defined by a symmetric configuration, the performance of a symmetrical VEEF arrangement can be achieved using reduced voltages on the lower electrodes, and/or increased performance over symmetrical VEEFs can be achieved at the lower electrode voltage levels no greater than those employed by the symmetrical configuration.

The present invention also facilitates tailoring of beam properties by providing movable lower electrodes that can increase or decrease the deflection angle (and thereby beam focus) of a beam propagating through an asymmetrical VEEF configuration.

The functions and process steps herein may be performed automatically or wholly or partially in response to user command. An activity (including a step) performed automatically is performed in response to executable instruction or device operation without user direct initiation of the activity.

It will be appreciated that the systems and methods disclosed are not exclusive. Other systems and methods may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The processes and applications may, in alternative embodiments, be located on one or more (e.g., distributed) processing devices accessing a network linking the elements of the disclosed system. Further, any of the functions and steps provided in the Figures may be implemented in hardware, software or a combination of both and may reside on one or more processing devices located at any location of a network linking the elements of the disclosed system or another linked network, including the Internet.

What is claimed is:

1. A method of controlling deflection of a charged particle beam in an electrostatic lens, comprising:

establishing a symmetrical electrostatic lens configuration comprising a plurality of electrodes disposed at unadjusted positions that are symmetric with respect to a central ray trajectory of the charged particle beam with applied unadjusted voltages that create fields symmetric with respect to the central ray trajectory;

calculating a symmetrical electric field corresponding to the set of unadjusted voltages;

arranging the plurality of electrodes at adjusted positions that are asymmetric with respect to the central ray trajectory, wherein the plurality of electrodes includes a plurality of upper electrodes and plurality of lower electrodes, wherein the plurality of lower electrodes diverge from the central ray trajectory;

obtaining a set of adjusted voltages for the plurality of electrodes, wherein the set of adjusted voltages corresponds to a set of respective potentials of the symmetric electric field at respective adjusted asymmetric positions; and applying the set of adjusted voltages to the plurality of electrodes arranged at the adjusted positions that are asymmetric with respect to the central ray trajectory when the charged particle beam passes therethrough.

2. The method of claim 1, wherein the central ray trajectory (CRT) lies along an arc, and the adjusted electrode positions lie below the CRT.

3. The method of claim 1, wherein the symmetrical electric field is uniform with respect to a direction perpendicular to the CRT.

4. The method of claim 1, wherein the electrostatic lens comprises a deceleration lens, and wherein the set of adjusted voltages is configured to produce a required deceleration of the charged particle beam.

5. A method of controlling deflection of a charged particle beam in an electrostatic lens, comprising:

obtaining a set of a upper electrode positions and a set of unshifted lower electrode positions for a symmetrical configuration that comprises a plurality of upper electrodes and a plurality of lower electrodes, wherein the symmetrical configuration is operable to produce a first deflection field that guides a central ray trajectory of the beam through a first deflection angle along a first path defining a center line of the symmetrical configuration, when a first set of voltages that includes a first set of lower electrode voltages is applied to the upper and lower electrodes;

arranging the plurality of lower electrodes at shifted positions closer to a center line of the symmetric lens configuration, wherein the central ray trajectory defines an increased deflection angle that is larger than the first deflection angle when the first set of voltages is applied to the upper and lower electrodes and wherein the plurality of lower electrodes diverges from the central ray trajectory;

estimating a set of reduced voltages for the plurality of lower electrodes, wherein the set of reduced voltages is configured to guide the central ray trajectory through a reduced deflection angle that is less than the increased deflection angle; and applying the set of reduced voltages to the plurality of lower electrodes of the asymmetric lens configuration when the charged particle beam passes therethrough, wherein the central ray trajectory of the passing charged particle beam is deflected through the reduced deflection angle, and wherein the set of reduced voltages is less than the first set of lower electrode voltages.

6. The method of claim 5, wherein the set of reduced voltages is configured to produce a lower deflection factor $F_{Ldefl}$ of the charged particle beam than a deflection factor $F_{Hdefl}$ produced by the first set of voltages.

7. The method of claim 5, wherein, when the set of reduced voltages is applied to the plurality of lower electrodes, the central ray trajectory intercepts a process wafer at a central portion of the process wafer.

8. The method of claim 5, wherein the arranging the plurality of lower electrodes at shifted positions closer to a center line comprises:

providing the electrostatic lens with a mechanism for moving at least some of the plurality of lower electrodes between a plurality of positions; and moving the at least some of the plurality of lower electrodes from the unshifted to shifted positions.

9. An asymmetric electrostatic lens system for controlling a charged particle beam, comprising:

an entrance aperture for said charged particle beam to pass therethrough, the charged particle beam having a central ray trajectory;

an exit aperture for said charged particle beam to pass therethrough;

a plurality of upper electrodes; and a plurality of lower electrodes, wherein the plurality of upper and lower electrodes are mutually arranged to define a space for the charged particle beam to pass therethrough, wherein the plurality of upper and lower electrodes are configured to receive a set of voltages to deflect a central ray trajectory of the charged particle beam through a nominal deflection angle, wherein the plurality of lower electrodes are configured to move from a set of unadjusted positions to a set of adjusted positions in which at least one lower electrode is disposed closer to the central ray trajectory than a corresponding upper electrode, and wherein the plurality of lower electrodes diverges from the central ray trajectory when the central ray trajectory passes through the exit aperture at the nominal deflection angle, wherein the plurality of lower electrodes are configured to receive a set of adjusted voltages that comprise respective potentials of a symmetric electric field at the respective adjusted positions, wherein the symmetric electric field is calculated when the plurality of upper electrodes and lower electrodes are arranged at the set of unadjusted positions and a set of unadjusted voltages is applied to the plurality of upper and lower electrodes, the set of unadjusted voltages configured to guide the central ray trajectory through the nominal deflection angle, wherein in the unadjusted positions the upper and lower electrodes are spaced equally from the central ray trajectory.

10. The asymmetric electrostatic lens system of claim 9, wherein at least some of the lower electrodes are operable to move between a plurality of electrode positions.

11. The asymmetric electrostatic lens system of claim 10, wherein the at least some of the lower electrodes are disposed on an actuated chassis.

12. The asymmetric electrostatic lens system of claim 10, wherein one or more of the at least some of the lower electrodes comprises a rotatable cam configured to rotate between a plurality of electrode positions.

13. The asymmetric electrostatic lens system of claim 10, wherein at least some of the lower electrodes are operable to move between a plurality of electrode positions independently of other lower electrodes.

14. The asymmetrical lens system of claim 9, further comprising:
- a machine readable storage medium encoded with:
  - the set of adjusted positions,
  - the set of unadjusted voltages; and
  - a computer program code such that, when the computer program code is executed by a processor, the processor performs a method comprising:
    - calculating the symmetric electric field; and
    - calculating the set of adjusted voltages; and
- a controller for sending signals to a set of power supplies to apply the set of adjusted voltages to the plurality of lower electrodes.

15. The asymmetric electrostatic lens system of claim 9, wherein the system comprises a deceleration lens.

16. The asymmetric electrostatic lens system of claim 15, wherein the system is configured to decelerate an ion beam having an initial energy of greater than about 20 keV to a final energy of about 1 to 20 keV, wherein the asymmetric lens is configured to provide equivalent focusing and deflection of the ion beam as that produced by a symmetric configuration in which upper and lower electrodes are maintained at equal perpendicular distances from the central ray trajectory.

17. The asymmetrical lens system of claim 10, wherein the set of lower electrodes are configured to shift from a set of first positions configured to deflect the beam through the nominal deflection angle to a set of shifted positions closer to the central ray trajectory than corresponding positions of the upper electrodes, wherein a deflection angle of the central ray trajectory is larger than the nominal deflection angle when the set of lower electrodes is disposed at the shifted positions.

* * * * *